US012676728B2

(12) United States Patent
Zhang et al.

(10) Patent No.: US 12,676,728 B2
(45) Date of Patent: Jul. 7, 2026

(54) CASCADE COMMUNICATION DEVICE AND METHOD AND BATTERY MANAGEMENT SYSTEM

(71) Applicant: Joulwatt Technology Co., Ltd., Hangzhou (CN)

(72) Inventors: Anyang Zhang, Hangzhou (CN); Tusheng Yao, Hangzhou (CN)

(73) Assignee: Joulwatt Technology Co., Ltd., Hangzhou (CN)

( * ) Notice: Subject to any disclaimer, the term of this patent is extended or adjusted under 35 U.S.C. 154(b) by 66 days.

(21) Appl. No.: 18/829,084

(22) Filed: Sep. 9, 2024

(65) Prior Publication Data

US 2025/0097004 A1     Mar. 20, 2025

(30) Foreign Application Priority Data

Sep. 15, 2023     (CN) ......................... 202311203171.X

(51) Int. Cl.
| *H04L 5/12* | (2006.01) |
| *H03L 7/081* | (2006.01) |
| *H03L 7/089* | (2006.01) |
| *H04L 7/033* | (2006.01) |

(52) U.S. Cl.
CPC .............. *H04L 7/033* (2013.01); *H03L 7/081* (2013.01); *H03L 7/089* (2013.01)

(58) Field of Classification Search
CPC .......... H04L 7/033; H03L 7/081; H03L 7/089

USPC ................ 375/262, 260, 259, 219, 295, 316
See application file for complete search history.

(56) References Cited

U.S. PATENT DOCUMENTS

| 2015/0023178 A1* | 1/2015 | Gruber | ..................... H04B 1/16 370/241 |
| 2023/0259158 A1* | 8/2023 | Bal | ........................... G06F 1/08 713/401 |

FOREIGN PATENT DOCUMENTS

| CN | 105068016 A | 11/2015 |
| CN | 106786879 A | 5/2017 |

* cited by examiner

*Primary Examiner* — Zewdu A Kassa
(74) *Attorney, Agent, or Firm* — IPro, PLLC

(57)     ABSTRACT

The present disclosure provides a cascade communication device and method and a battery management system. The cascade communication device includes: a first interface for received data in uplink mode and transmitting data in downlink mode, and receiving a first clock signal; a second interface for transmitting data in uplink mode and received data in downlink mode, and transmitting a second clock signal; an edge detection module for detecting an edge of the first clock signal; a clock generation module for generating the second clock signal according to the edge of the first clock signal; a data processing module for reconstructing a received data according to the first clock signal and the second clock signal to generate a transmission data. The cascade communication system includes a serial synchronous interface based on the public protocol, the reliability of multi-stage data transmission is improved, and a greater number of node devices is supported.

16 Claims, 5 Drawing Sheets

CASCADE COMMUNICATION DEVICE AND METHOD AND BATTERY MANAGEMENT SYSTEM

CROSS-REFERENCE TO RELATED APPLICATIONS

This present disclosure claims priority to a Chinese patent application No. 202311203171X, filed on Sep. 15, 2023, and entitled "cascade communication device and method and battery management system", the entire contents of which are incorporated herein by reference, including the specification, claims, drawings and abstract.

FIELD OF TECHNOLOGY

The present disclosure relates to a field of electronic circuit, and in particularly, to a cascade communication device and method for a plurality of node devices and a battery management system (BMS).

BACKGROUND

In an application scenario such as a battery management system, a plurality of equalization modules are connected to a plurality of battery packs to equalize voltages of a plurality of battery cells in corresponding battery pack, so as to maintain consistency of the plurality of battery cells. A cascade communication system includes an analog front end (AFE) and plurality of equalization modules. In an operation state, the plurality of battery packs are connected in series with each other with different reference ground potentials, and the plurality of equalization modules each have a reference ground potential of the corresponding battery pack. Therefore, the plurality of equalization modules cannot use a bus communication protocol with each other, but rather a cascade communication scheme. In the cascade communication scheme, the analog front end serves as a host device, and the plurality of equalization modules serve as node devices, so as to realize cascade data communication between the host device and the node devices. When data is transmitted by the host computer, data is transmitted from one node device to another node device along a uplink. When the data is received by the host computer, the data is transmitted from one node device to another along a downlink.

An existing cascade communication scheme is a differential synchronous cascade communication scheme based on a private protocol of Analog Devices, Inc. (ADI). The differential asynchronous cascade communication scheme adopts a differential communication interface, so that the ability to resist interference could be improved by transmitting data by use of differential signals. However, the differential cascade communication requires both communication parties to support the protocol, and for communication between the analog front end and the equalization modules, the analog front end is required to reserve the communication protocol interface. Since the interface should conform to the ADI private protocol, the existing analog front ends do not have a reserved interface with this communication protocol. In addition, differential cascade communication adopts asynchronous communication, which requires high clock accuracy between communication modules, and usually requires clock accuracy within ±2%. Finally, the circuit structure of the differential cascade communication is more complex and costly.

Another existing cascade communication scheme is a daisy-chain topology-based point-to-point communication scheme. A plurality of node devices are connected into a linear link, wherein each node device serves as a transmitting and receiving device to achieve communication between any node devices. The point-to-point communication device does not require a host node to coordinate communication, but the design of the node device is complex and the power consumption is high. A further improved cascade communication scheme is a daisy-chain topology-based synchronous communication scheme, wherein a uplink data signal is received by use of a uplink clock signa, and a downlink data signal is received by use of a compensation signal of the uplink clock signal. The synchronous communication scheme requires low clock accuracy between communication modules, which can save circuit cost and reduce power consumption. The main disadvantage is that the compensation amount needs to be preset according to the number of node devices, so it is difficult to flexibly support a large number of node devices. Further, as the number of node devices increases, the distortion of the clock signal and data signal will cause the reliability of multi-stage data transmission to deteriorate.

Therefore, it is desirable to further improve the cascade communication scheme to support public protocol interfaces and improve the reliability of multi-stage data transmission.

SUMMARY

T In view of above problems, an object of the present disclosure to provide a cascade communication device and method and a battery management system, so as to solve technical problems mentioned in above-mentioned prior art.

According to an aspect of the present disclosure, a cascade communication device is provided and includes:

a first interface, configured to receive data in an uplink mode and transmit data in a downlink mode, and receive a first clock signal;

a second interface, configured to transmit data in the uplink mode and receive data in the downlink mode, and transmit a second clock signal;

an edge detection module, configured to detect an edge of the first clock signal;

a clock generation module, configured to generate the second clock signal according to the edge of the first clock signal; and a data processing module, configured to reconstruct a received data according to the first clock signal and the second clock signal to generate a transmission data.

Optionally, in the uplink mode, the data processing module forwards data bit by bit, and in a downlink mode, the processing module forwards data byte by byte.

Optionally, at the edge of the first clock signal, the first clock signal flips from a first level to a second level, and the clock generation module generates corresponding edge of the second clock signal after the edge of the first clock signal delayed to a first level period.

Optionally, a delay time T1 of a falling edge of the second clock signal relative to a falling edge of the first clock signal is:

$$(n-1)*Tclk + TL < T1 < n*Tclk,$$

wherein Tclk represents a clock period of the first clock signal, TL represents a low-level period of the first clock signal, and n is an arbitrary integer greater than or equal to 1.

Optionally, a delay time T2 of a rising edge of the second clock signal relative to a rising edge of the first clock signal is:

$$(n-1)*Tclk + TH < T2 < n*Tclk,$$

wherein Tclk represents a clock period of the first clock signal, TH represents a high-level period of the first clock signal, and n is an arbitrary integer greater than or equal to 1.

Optionally, a level conversion module is connected to the data processing module, wherein the level conversion module is configured to convert a reference ground potential of the received data to a reference ground potential of a present stage, or to convert a reference ground potential of the transmission data to a reference ground potential of the next stage.

Optionally, the first interface and the second interface conform to an Inter-Integrated Circuit (I2C) protocol or an serial peripheral interface (SPI) protocol.

According to another aspect of the present disclosure, a cascade communication method is provided and includes:

detecting an edge of a first clock signal;

generating a second clock signal according to the edge of the first clock signal; and 以及 reconstructing a received data according to the first clock signal and the second clock signal to generate a transmission data.

Optionally, data is forwarded bit by bit in an uplink mode and data is forwarded byte by byte in a downlink mode.

Optionally, at the edge of the first clock signal, the first clock signal flips from a first level to a second level, and a corresponding edge of the second clock signal is generated after the edge of the first clock signal delayed to a first level period.

Optionally, a delay time T1 of a falling edge of the second clock signal relative to a falling edge of the first clock signal is:

$$(n-1)*Tclk + TL < T1 < n*Tclk,$$

wherein Tclk represents a clock period of the first clock signal, TL represents a low-level period of the first clock signal, and n is an arbitrary integer greater than or equal to 1.

Optionally, a delay time T2 of a rising edge of the second clock signal relative to a rising edge of the first clock signal is:

$$(n-1)*Tclk + TH < T2 < n*Tclk,$$

wherein Tclk represents a clock period of the first clock signal, TH represents a high-level period of the first clock signal, and n is an arbitrary integer greater than or equal to 1.

converting a reference ground potential of the received data to a reference ground potential of a present stage, or converting a reference ground potential of the transmission data to a reference ground potential of the next stage.

According to another aspect of the present disclosure, there is provided a battery management system for battery state management of a plurality of battery packs, wherein each of the plurality of battery packs comprises a plurality of battery cells, the plurality of battery packs are connected in series to provide a supply voltage, and the battery management system includes:

a plurality of equalization modules respectively connected to the plurality of battery packs, configured to equalize voltages of the plurality of battery cells in corresponding battery pack to maintain consistency of the plurality of battery cells;

an analog front end connected to the plurality of equalization modules, configured to obtain state parameters of the plurality of battery cells through the plurality of equalization modules; and a controller connected to the analog front end, configured to generate an equalization control signal according to the state parameter, wherein each of the plurality of equalization modules includes an above-mentioned cascade communication device.

Optionally, the plurality of equalization modules serve as a plurality of node devices of a cascade communication system, respectively, and have a reference ground potential corresponding to the plurality of battery packs, respectively.

Optionally, the cascade communication device includes: a level conversion module, configured to convert a reference ground potential of the transmission data to a reference ground potential of a next stage node device of the plurality of node devices; or to convert a reference ground potential of the received data to a reference ground potential of a current stage node device of the plurality of node devices.

Beneficial effects of the present disclosure include at least:

The cascade communication device according to the embodiments of the present disclosure has the first interface and the second interface with a bidirectional data channel and a unidirectional clock channel. Therefore, a cascade communication system could be formed by use of a serial synchronous interface based on a public protocol, and the interface compatibility of the cascade communication device is strong, which is conducive to wide application and reduce the interface cost. In the cascade communication system, the plurality of node devices each include the cascade communication device connected, and are connected through the cascade communication device to achieve a serial synchronous cascade communication scheme. Therefore, the clock accuracy of the cascade communication device is low, and the circuit structure is simple, which is conducive to reducing the circuit cost. The edge detection module and the clock generation module in the cascade communication device together generate a delayed correction clock signal. The cascade communication device with the plurality of node devices performs clock correction step by step, so that the clock signal is not distorted after multi-stage cascade transmission. The cascade communication device reconstructs the transmission data based on the delayed clock signal, thereby improving the reliability of multi-stage data transmission, and supporting a greater number of node devices in the cascade communication system.

In a specific embodiment, the cascade communication device includes a level conversion module for converting the reference ground potential of the received data and the received clock to the reference ground potential of the present level, or converting the reference ground potential of the transmission data and the transmitted clock to the reference ground potential of the next stage. In the battery management system, the plurality of equalization modules serve as the node devices of the cascaded communication system respectively including the cascade communication device. The reference ground potential of the plurality of equalization modules corresponds to the reference ground potential of the corresponding battery pack, respectively. The cascade communication device adopts the level conversion module to solve the problem of different reference ground potentials in the multi-stage cascade system. Therefore, a greater number of equalization modules could be supported in the battery management system to meet the multi-stage cascade communication requirements of the high-power battery module.

BRIEF DESCRIPTION OF THE DRAWINGS

The foregoing and other objects, features and advantages of the present disclosure will become clearer by the following description of embodiments of the present disclosure with reference to the accompanying drawings.

DETAILED DESCRIPTION

The present disclosure is described below based on examples, but the present disclosure is not limited to these examples. In the following detailed description of the present disclosure, some specific parts of details are described in detail. the present disclosure can be fully understood without a description of these parts to those skilled in the art. To avoid confusing the essence of the present disclosure, well-known methods, processes, processes, elements, and circuits are not described in detail.

Furthermore, it should be understood by those of ordinary skill in the art that the drawings provided herein are for illustrative purposes only, and that the drawings are not necessarily drawn to scale.

It should be understood that in the following description, the word "circuit" refers to a conductive circuit consisting of at least one element or sub-circuit through electrical coupling or electromagnetic coupling. When an element or a circuit is said to be "connected" to another element or an element/circuit is said to be "connected" between two nodes, it may be directly coupled or connected to another element or there may be an intermediate element, and the connection between the elements may be physical, logical, or a combination thereof. Conversely, when an element is said to be "directly coupled" or "directly connected" to another element inch, it means that there is no intermediate element between the two.

the words "including", "comprising" and the like throughout the specification and claims shall be construed as inclusive and not exclusive or exhaustive unless the context clearly requires otherwise; That is, the meaning of "including but not limited to".

It is to be understood that the terms "first", "second" and the like are used for descriptive purposes only and are not to be construed as indicating or implying relative importance. In addition, in the description herein, unless otherwise stated, the meaning of "plurality of" and "multiple" is two or more.

In electric vehicles and power storage systems, multiple battery packs connected in series are required to provide a desired supply voltage. Inside the battery pack, multiple battery cells could be connected in series, in parallel, or in a hybrid connection, and each battery pack could reach a desired output voltage and/or output current.

Figure 1:
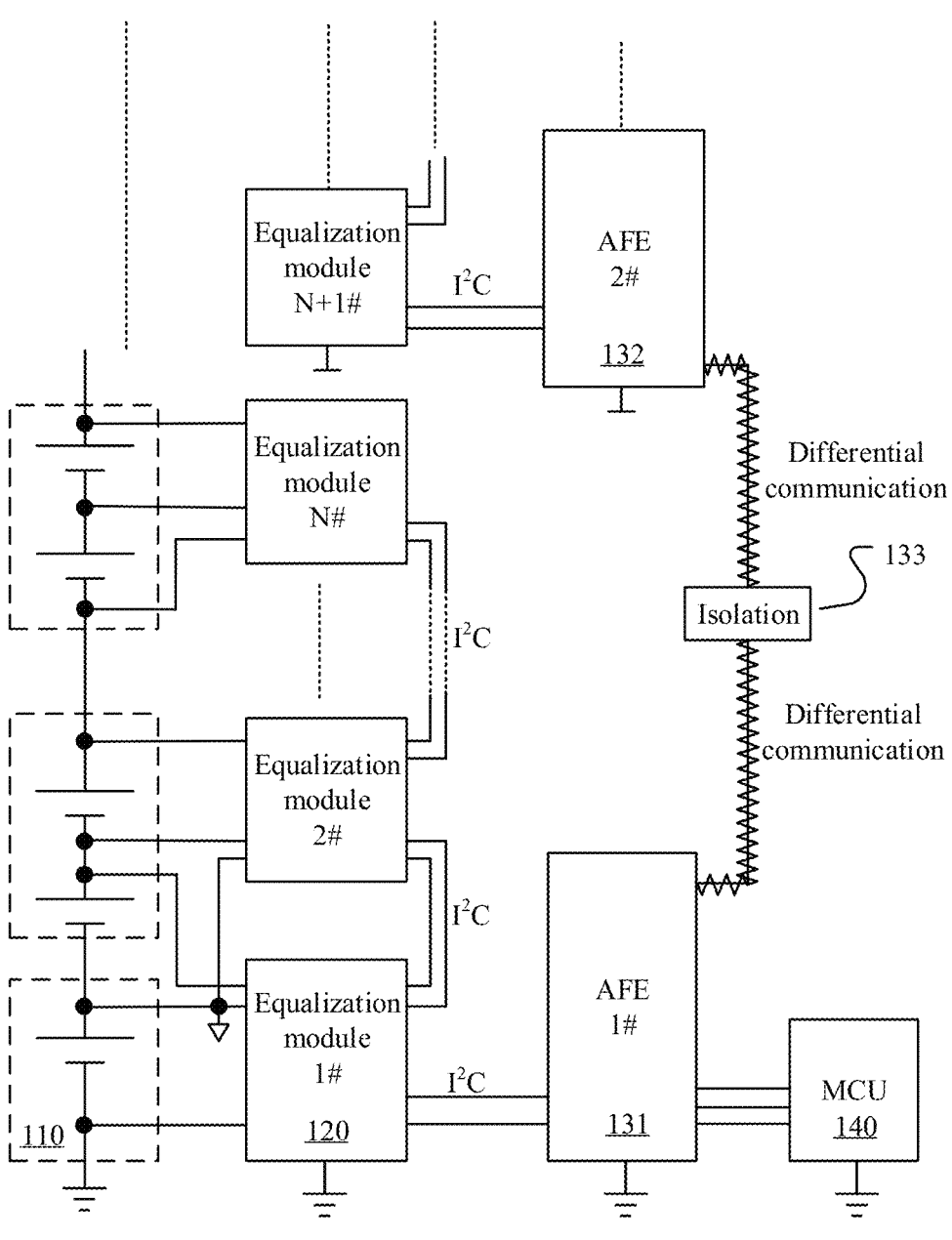
FIG. 1 shows a schematic block diagram of a battery management system according to a first embodiment of the present disclosure.

FIG. 1 shows a schematic block diagram of a battery management system according to a first embodiment of the present disclosure; A battery management system (BMS) is a system for battery state management in battery packs with main functions of: battery condition monitoring, battery protection, voltage balancing, energy management, etc. For clarity, only circuit modules related to voltage equalization of the battery management system 100 are shown in FIG. 1.

The battery management system 100 includes a plurality of equalization modules 120, analog front ends 131 and 132, isolation modules 133, and a controller 140.

The plurality of equalization modules 120 respectively connected to a corresponding battery pack in the plurality of battery packs 110, so as to equalize voltages of the plurality of battery cells in the corresponding battery pack to maintain consistency of the plurality of battery cells. The number and connection of battery cells in different battery packs 110 may be the same or different. The equalization module 120 could regulate a voltage of each battery cell according to an internal structure of the corresponding battery pack. For example, the equalization module adopts electronic switches and energy storage elements to transfer electrical energy between the plurality of battery cells in the battery pack, so that all battery cells in the battery pack could be charged to the same voltage level.

The analog front end (AFE) 131 and a first set of equalization modules (1st to Nth equalization modules) of the plurality of equalization modules 120 form a first cascade communication system. The analog front end (AFE) 132 and a second set of equalization modules (starting from N+1st equalization module) of the plurality of equalization modules 120 form a second cascade communication system. The analog front ends 131 and 132 obtain a state parameter of the plurality of battery cells through the plurality of equalization modules 120. The state parameter includes, for example, the voltage and temperature of the battery cell.

The controller 140 and the analog front ends 131 and 132 form a third cascade communication system. The analog front ends 131 and 132 are connected through the isolation module 133. The isolation module 133 is used to solve the problem of a reference ground potential of the analog front end 131 and a reference ground potential of the analog front end 132 being different. The controller 140 obtains the state parameter of the plurality of battery cells in the plurality of battery packs 110 through the analog front ends 131 and 132, generates an equalization control signal according to the state parameter, and provides an equalization control signal to the plurality of equalization modules 120, thereby achieving voltage equalization of the plurality of battery packs 110.

In a case of the plurality of battery packs 110 being connected in series, the plurality of battery packs 110 are connected between a power supply terminal and a ground terminal, and a reference ground potential of each battery pack is an output voltage of a previous battery pack. Accordingly, a reference ground of the equalization module 120 is the reference ground potential of the corresponding battery pack 110. Since the reference ground potentials of the plurality of equalization modules 120 are different, the plurality of equalization modules 120 cannot use a bus communication protocol with each other, but rather a cascade communication scheme In this embodiment, the analog front ends 131 and 132 respectively support dual communication protocols, wherein the first cascade communication system and the second cascade communication system adopt a serial synchronous cascade communication scheme of the present disclosure, and the third cascade communication system adopts a differential synchronous cascade communication scheme of Analog Devices, Inc. The analog front ends 131 and 132 transmit data to each other based on a differential asynchronous cascade communication protocol. The analog front ends 131 and 132 transmit data with corresponding plurality of equalization modules 120 based on a serial synchronous cascade communication protocol.

In an alternative embodiment, the analog front ends 131 and 132 support a single communication protocol, wherein the first cascade communication system, the second cascade communication system, and the third cascade communication system all adopts the serial synchronous cascade communication protocol of the present disclosure.

In the cascade communication scheme of the present disclosure, analog front ends 131 and 132 serve as a host device, and a plurality of equalization modules 120 serve as node devices, so as to achieve the cascade data communication between the host device and the node device.

In the following description, the cascade communication scheme of the present disclosure will be described in detail with the analog front end 131 as an example.

The cascade communication scheme includes a bidirectional data channel and an unidirectional clock channel.

With respect to the bidirectional data channel, the cascade communication scheme includes an uplink from the analog front end 131, sequentially through the first equalization module to the n−1st equalization module, up to the Nth equalization module, and a downlink from the Nth equalization module, sequentially through the n−1st equalization module to the first equalization module, up to the analog front end 131. When the host device transmits data, the data is transmitted from one node device to another node device along the uplink. When the host device receives data, the data is transmitted from one node device to another along the downlink.

With respect to the unidirectional clock channel, the clock transmission direction in the cascade communication scheme is always from an analog front end 131, sequentially through the first equalization modules to the n−1th equalization modules, until the Nth equalization modules.

In the battery management system according to the present embodiment, the plurality of equalization modules serve as node devices of the cascade communication system respectively including cascade communication devices. The cascade communication device reconstructs the transmission data based on delayed clock signals, so that the cascade communication system could be formed by use of a serial synchronous interface based on the public protocol, the reliability of multi-stage data transmission is improved, and a greater number of node devices in the cascade communication system is supported.

Figure 2:
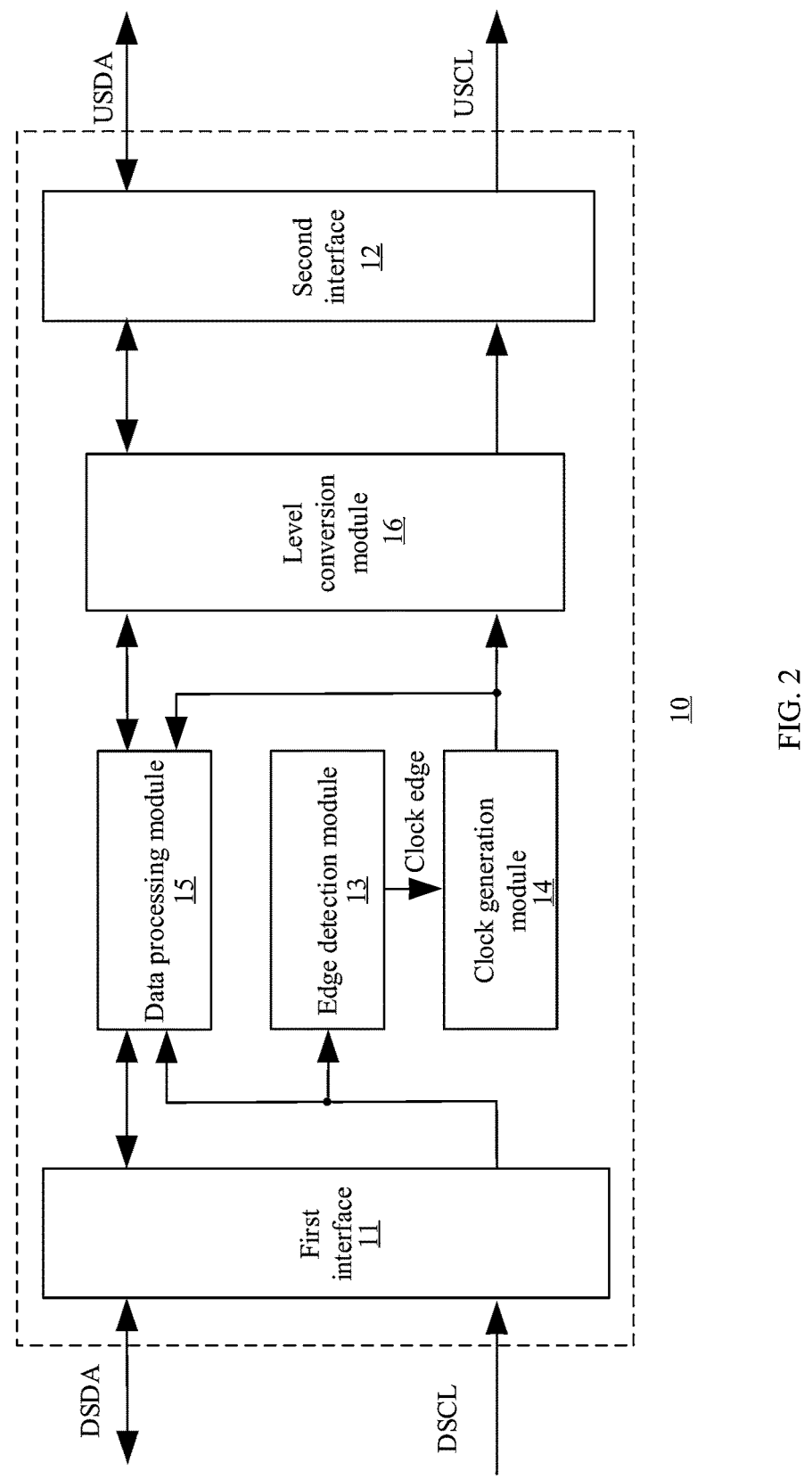
FIG. 2 shows a schematic block diagram of a cascade communication device according to a second embodiment of the present disclosure.

FIG. 2 shows a schematic block diagram of a cascade communication device according to a second embodiment of the present disclosure.

The cascade communication device 10 includes a first interface 11, a second interface 12, an edge detection module 13, a clock generation module 14, and a data processing module 15.

The first interface 11 includes a data channel and a clock channel, wherein the data channel supports bidirectional data communication. The first interface 11 is used for receiving a first data DSDA in an uplink mode and transmitting the first data DSDA in a downlink mode, and receiving a first clock signal DSCL. The data channel and clock channel of the first interface 11 belong to the same interface protocol or different interface protocols. For example, the first interface 11 conform to an inter-integrated circuit (I2C) protocol or an serial peripheral interface (SPI) protocol.

The second interface 12 includes a data channel and a clock channel, wherein the data channel supports bidirectional data communication. The second interface 12 is used for transmitting a second data USDA in the uplink mode and receiving the second data USDA in the downlink mode, and transmitting a second clock signal USCL. The data channel and clock channel of the second interface 12 belong to the same interface protocol or different interface protocols. For example, the second interface 12 conform to the I2C protocol or the SPI protocol.

The bidirectional data channels of the first interface 11 and the second interface 12 are capable of supporting bidirectional data transmission of the cascade communication device 10. In the uplink mode, a received data of the cascade communication device 10 is the first data DSDA, and a transmission data is the second data USDA. In the downlink mode, the received data of the cascade communication device 10 is the second data USDA, and the transmission data is the first data DSDA. In both uplink mode and downlink mode, a receiving clock signal is the first clock signal DSCL, and a transmission clock signal is the second clock signal USCL.

The edge detection module 13 is used for detecting an edge of the first clock signal, wherein the edge includes a falling edge and a rising edge of the first clock signal. The clock generation module 14 generates the second clock signal USCL according to the edge of the first clock signal DSCL. In this embodiment, the clock generation module 14 delays a first delay time from a falling edge of the first clock signal to a high-level period of the first clock signal to generate a falling edge of the second clock signal, and delays a second delay time from a rising edge of the first clock signal to a low-level period of the first clock signal to generate a rising edge of the second clock signal. By setting the first delay time and the second delay time being close to equal values, a corrected clock signal could be obtained.

The data processing module 15 reconstructs the received data according to the first clock signal DSCL and the second clock signal USCL to generate the transmission data. In the uplink mode, the data reconstruction of the data processing module 15 includes: obtaining the received data according to the first clock signal DSCL; and generating the transmission data according to the second clock signal USCL. In the downlink mode, the data reconstruction of the data processing module 15 includes: obtaining the received data according to the second clock signal USCL; and generating the transmission data according to the first clock signal DSCL.

Optionally, the data processing module 15 includes a receiving module, a transmission module, and a cache module.

In the uplink mode, the receiving module serves a first data DSDA as the received data, obtains the received data according to the first clock signal DSCL, the transmission module serves a second data USDA as the transmission data, and generates the transmission data according to the second clock signal USCL.

In the downlink mode, the receiving module serves the second data USDA as the received data, obtains the received data according to the second clock signal USCL, the transmission module serves the first data DSDA as the transmission data, and generates the transmission data according to the first clock signal DSCL.

Further, in the uplink mode, the first clock signal DSCL serves as a receiving clock signal, the second clock signal USCL serves as a transmission clock signal, and the receiving clock signal is earlier than the transmission clock signal, so that the data processing module 15 could forward the data bit by bit. In the downlink mode, the second clock signal USCL serves as the receiving clock signal, the first clock signal DSCL serves as the transmission clock signal, and the receiving clock signal is later than the transmission clock signal, so that the data processing module 15 could forward data byte by byte. The cache module in the data processing module 15 is used for storing one byte of the received data in the downlink mode.

Optionally, the cascade communication device 10 further includes a level conversion module 16. The level conversion module 16 is connected to the data processing module 15.

In this embodiment, the level conversion module 16 is connected between the data processing module 15 and the second interface 12. In the uplink mode, the level conversion module 16 raises a level of the transmission data relative to the received data, and in the downlink mode, the level conversion module 16 decreases the level of the transmission data relative to the received data. The level conversion module 16 may further be connected to the clock generation module 14, so as to raise a level of the second clock signal USCL relative to the first clock signal DSCL. In a case of being applied to the battery management system, the level conversion module 16 is used for setting the reference ground potential of the transmission data to the reference ground potential of a next stage battery pack in a data transmission direction, and setting the reference ground potential of the transmission clock to the reference ground potential of the next level battery pack in a clock transmission direction.

In an alternative embodiment, the level conversion module 16 is connected between the first interface 11 and the data processing module 15. In the uplink mode, the level conversion module 16 raises a level of the received data directly, and in the downlink mode, the level conversion module 16 decreases the level of the transmission data directly. The level conversion module 16 may further be connected to the clock generation module 14, so as to raise the level of the second clock signal USCL relative to the first clock signal DSCL. In the case of being applied to the battery management system, the level conversion module 16 is used for setting the reference ground potential of the received data to the reference ground potential of a current stage battery pack in the data transmission direction, and setting the reference ground potential of the received clock to the reference ground potential of the current stage battery pack in the clock transmission direction.

It should be noted that the level conversion module 16 inside the cascade communication device 10 is optional. In some application scenarios, the reference ground potentials of the different stages of the multi-stage cascade communication system are the same, so that a level conversion function is not necessary in the cascade communication device 10. In other application scenarios, even if the reference ground potentials of the different stages of the multi-stage cascade communication system are different, the level conversion function is not necessary in the cascade communication device 10, for example, the level conversion module 16 could be formed by use of an external circuitry of the cascade communication device 10.

Optionally, the data processing module 15 monitors the received data to obtain a start signal and a stop signal for the data communication. For example, the start signal and the stop signal are signal edges that received data. The data processing module 15 forwards a delayed start signal before forwarding the data and forwards a delayed stop signal after forwarding the data.

The cascade communication device according to the embodiments of the present disclosure has the first interface and the second interface with the bidirectional data channel and the unidirectional clock channel. Therefore, the cascade communication device could be formed by use of a serial synchronization interface based on a public protocol, and the interface compatibility of the cascade communication device is strong, which is conducive to wide application and reduce the interface cost. In the cascade communication system, the plurality of node devices each include the cascade communication device connected, and are connected through the cascade communication device to achieve a serial synchronous cascaded communication scheme. Therefore, the clock accuracy of the cascade communication device is low, and the circuit structure is simple, which is conducive to reducing the circuit cost. The edge detection module and the clock generation module in the cascade communication device together generate a delayed correction clock signal. The cascade communication device with the plurality of node devices performs clock correction step by step, so that the clock signal is not distorted after multi-stage cascade transmission. The cascade communication device reconstructs the transmission data based on the delayed clock signal, thereby improving the reliability of multi-stage data transmission, and supporting a greater number of node devices in the cascade communication system.

In a specific embodiment, the cascade communication device includes a level conversion module for converting the reference ground potential of the received data and the received clock to the reference ground potential of the present level, or converting the reference ground potential of the transmitted data and the transmitted clock to the reference ground potential of the next stage. In the battery management system, the plurality of equalization modules serve as the node devices of the cascaded communication system respectively include the cascade communication device. The reference ground potential of the plurality of equalization modules corresponds to the reference ground potential of the corresponding batteries, respectively. The cascade communication device adopts the level conversion module to solve the problem of different reference ground potentials in the multi-stage cascade system. Therefore, a greater number of equalization modules could be supported in the battery management system to meet the multi-stage cascade communication requirements of the high-power battery module.

Figure 3:
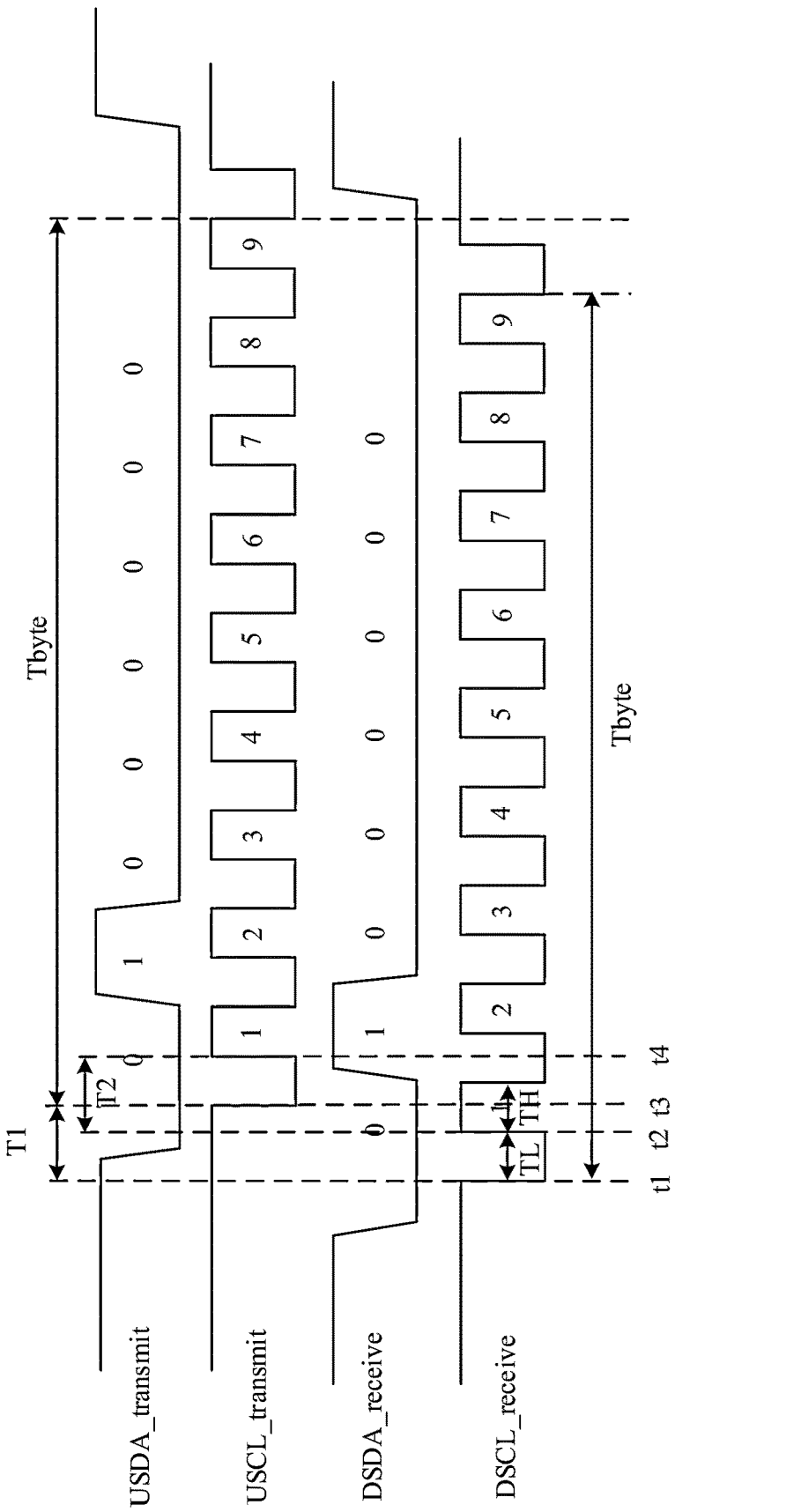
FIG. 3 shows a waveform diagram of the cascade communication device shown in FIG. 2 operating in an uplink.

FIG. 3 shows a waveform diagram of the cascade communication device shown in FIG. 2 operating in an uplink mode.

The first data DSDA and the first clock signal DSCL received in uplink mode by the first interface 11 of the cascade communication device are represented as DSDA_receive and DSCL_receive, respectively, and the second data USDA and the second clock signal USCL transmitted in uplink mode by the second interface 12 of the cascade communication device are represented as USDA_transmit and USCL_transmit, respectively.

At time t1, at a falling edge of the first clock signal DSCL, the first clock signal DSCL flips from high to low, and the clock generation module 14 generates a falling edge of the second clock signal USCL at time t3 after the falling edge of the first clock signal DSCL delayed to a high-level period.

A delay time T1 of the falling edge of the second clock signal USCL relative to the falling edge of the first clock signal DSCL could be represented as:

$$(n-1)*Tclk + TL < T1 < n*Tclk,$$

wherein Tclk represents a clock period of the first clock signal DSCL, TL represents a low-level period of the first clock signal DSCL, and n is an arbitrary integer greater than or equal to 1.

At time t2, at the rising edge of the first clock signal DSCL, the first clock signal DSCL flips from low to high, and the clock generation module 14 generates a rising edge of the second clock signal USCL at time t4 after the rising edge of the first clock signal DSCL delayed to a low-level period.

A delay time T2 of the rising edge of the second clock signal USCL relative to the rising edge of the first clock signal DSCL could be represented as:

$$(n-1)*Tclk + TH < T2 < n*Tclk,$$

Wherein Tclk represents the clock period of the first clock signal DSCL, TH represents a high-level period of the first clock signal DSCL, and n is an arbitrary integer greater than or equal to 1.

Therefore, by selecting the first delay time and the second delay time being close to equal values, a corrected clock signal could be obtained. That is, the second clock signal USCL is the corrected clock signal delayed with respect to the first clock signal DSCL.

When the data is received, the edge of the first data DSDA is aligned with the first clock signal DSCL. When the data is transmitted, the edge of the second data USDA is aligned with the second clock signal USCL.

Taking the I2C interface protocol as an example, each byte cycle Tbyte of data communication includes 9 clock cycles, including 8-bit data and one ACK or NACK signal. In the uplink mode, the first clock signal DSCL serves as the receiving clock signal, the second clock signal USCL serves as the transmission clock signal, and the receiving clock signal is earlier than the transmission clock signal, so that the data processing module 15 could forward the data bit by bit.

Figure 4:
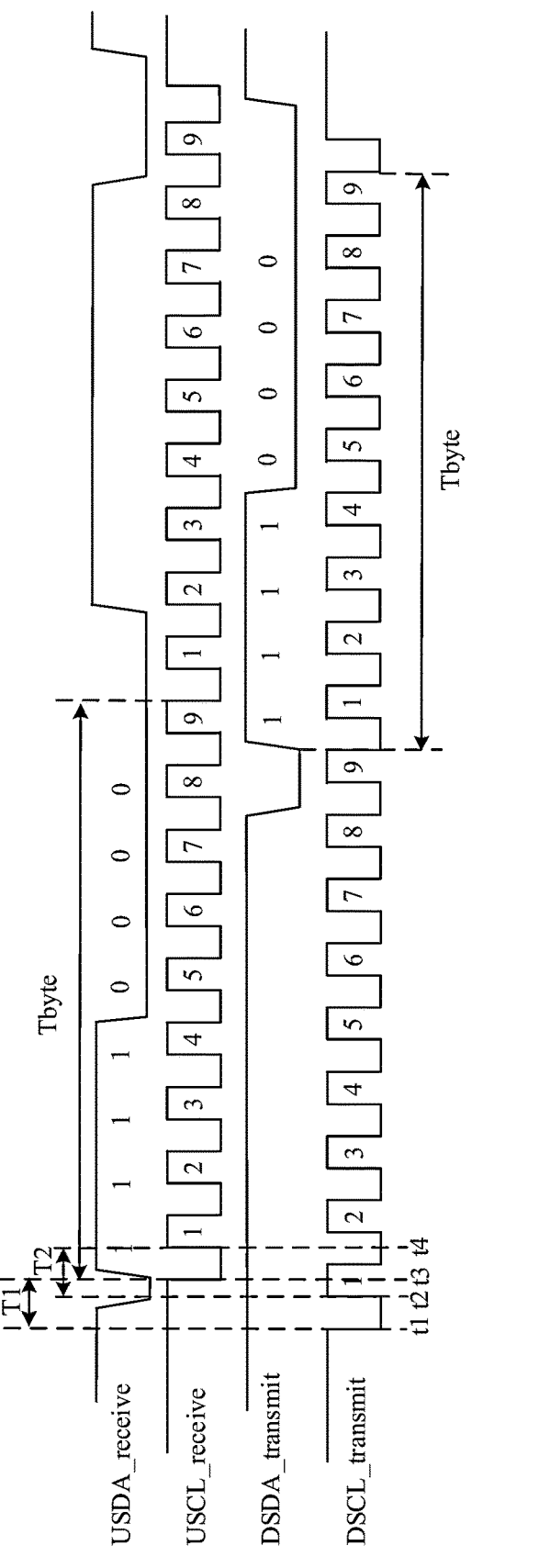
FIG. 4 shows a waveform diagram of the cascade communication device shown in FIG. 2 operating in the downlink.

FIG. 4 shows a waveform diagram of the cascade communication device shown in FIG. 2 operating in the the downlink mode.

The first data DSDA and the first clock signal DSCL transmitted in the downlink mode by the first interface 11 of the cascade communication device are represented as DSDA transmit and DSCL_transmit, respectively, and the second data USDA and the second clock signal USCL received in the downlink mode by the second interface 12 of the cascade communication device are represented as USDA_receive and USCL_receive, respectively.

In the downlink mode, the cascade communication device generates the second clock signal USCL according to the first clock signal DSCL in a same way as in the uplink mode. The second clock signal USCL is the corrected clock signal delayed with respect to the first clock signal DSCL, which will not be described in detail.

Further, the data processing module 15 in the cascade communication device data reconstructs the second data USDA according to the first clock signal DSCL and the second clock signal USCL to generate the first data DSDA. When the data is received, the edge of the second data USDA is aligned with the second clock signal USCL. When the data is transmitted, the edge of the first data DSDA is aligned with the first clock signal DSCL.

Taking the I2C interface protocol as an example, each byte cycle Tbyte of data communication includes 9 clock cycles, including 8-bit data and one ACK or NACK signal. In the downlink mode, the first clock signal DSCL serves as the transmission clock signal, and the second clock signal USCL serves as the receiving clock signal, and the receiving clock signal is later than the transmission clock signal, so that the data processing module 15 could forward the data byte by byte.

Figure 5:
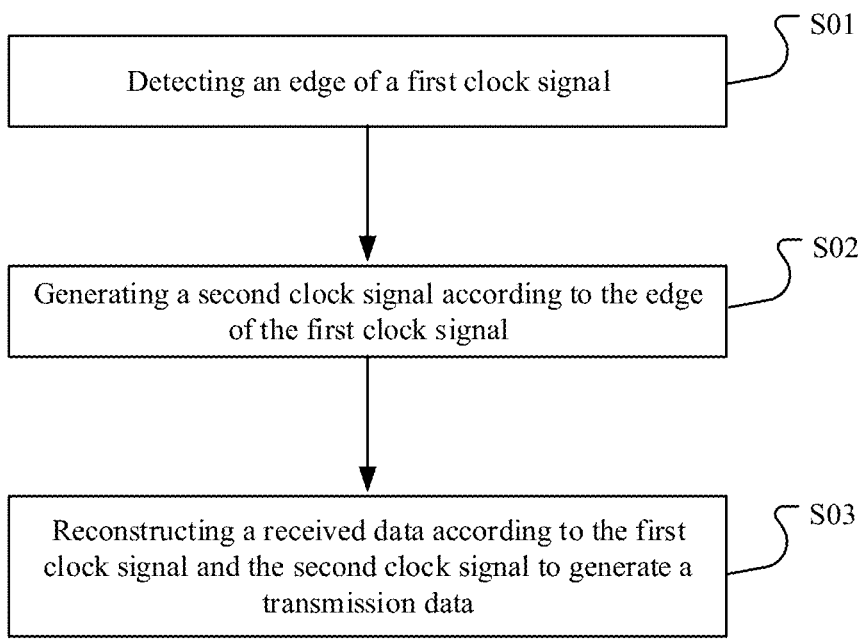
FIG. 5 shows a flowchart of a cascade communication method according to a third embodiment of the present disclosure.

FIG. 5 shows a flowchart of a cascade communication method according to a third embodiment of the present disclosure.

The cascade communication method includes steps S01 to S03.

In step S01, detecting an edge of a first clock signal. The edge of the first clock signal includes a falling edge and a rising edge.

In step S02, generating a second clock signal according to the edge of the first clock signal.

At the edge of the first clock signal, the first clock signal flips from a first level to a second level, and a corresponding edge of the second clock signal is generated by a clock generation module after the edge of the first clock signal delayed to a first level period.

A delay time T1 of a falling edge of the second clock signal relative to a falling edge of the first clock signal could be represented as:

$$(n-1)*Tclk + TL < T1 < n*Tclk,$$

Wherein, Tclk represents a clock period of the first clock signal, TL represents a low-level period of the first clock signal, and n is an arbitrary integer greater than or equal to 1.

A delay time T2 of a rising edge of the second clock signal relative to a rising edge of the first clock signal could be represented as:

$$(n-1)*Tclk + TH < T2 < n*Tclk,$$

Wherein, Tclk represents a clock period of the first clock signal, TH represents a high-level period of the first clock signal, and n is an arbitrary integer greater than or equal to 1.

In step S03, reconstructing a received data according to the first clock signal and the second clock signal to generate a transmission data.

In an uplink mode, data reconstruction includes: obtaining the received data according to the first clock signal; and generating the transmission data according to the second clock signal. Further, the data is forwarded bit by bit in the uplink mode.

In a downlink mode, data reconstruction includes: obtaining the received data according to the second clock signal; and generating the transmission data according to the first clock signal. Further, the data is forwarded byte by byte in the downlink mode.

Optionally, the cascade communication method further includes: raising a level of the transmission data relative to the received data in the uplink mode; and decreasing the level of the transmission data relative to the received data in the downlink mode.

Optionally, the cascade communication method further includes: raising a level of the second clock signal relative to the first clock signal.

The foregoing is only a specific embodiment of the disclosure and is not intended to limit the disclosure, which may be subject to various modifications and variations for those skilled in the art. Any modification, equivalent substitution, improvement, etc. made within the spirit and principles of the present disclosure shall be included within the scope of protection of the present disclosure.

What is claimed is:

1. A cascade communication device, comprising:
a first interface, configured to receive data in an uplink mode and transmit data in a downlink mode, and receive a first clock signal;
a second interface, configured to transmit data in the uplink mode and receive data in the downlink mode, and transmit a second clock signal;
an edge detection module, configured to detect an edge of the first clock signal;
a clock generation module, configured to generate the second clock signal according to the edge of the first clock signal; and
a data processing module, configured to reconstruct a received data according to the first clock signal and the second clock signal to generate a transmission data.

2. The cascade communication device according to claim 1, wherein in the uplink mode, the data processing module forwards data bit by bit, and in the downlink mode, the data processing module forwards data byte by byte.

3. The cascade communication device according to claim 1, wherein at the edge of the first clock signal, the first clock signal flips from a first level to a second level, and the clock generation module generates corresponding edge of the second clock signal after the edge of the first clock signal delayed to a first level period.

4. The cascade communication device according to claim 3, wherein a delay time T1 of a falling edge of the second clock signal relative to a falling edge of the first clock signal is:

$$(n-1)*Tclk + TL < T1 < n*Tclk,$$

wherein Tclk represents a clock period of the first clock signal, TL represents a low-level period of the first clock signal, and n is an arbitrary integer greater than or equal to 1.

5. The cascade communication device according to claim 3, wherein a delay time T2 of a rising edge of the second clock signal relative to a rising edge of the first clock signal is:

$$(n-1)*Tclk + TH < T2 < n*Tclk,$$

wherein Tclk represents a clock period of the first clock signal, TH represents a high-level period of the first clock signal, and n is an arbitrary integer greater than or equal to 1.

6. The cascade communication device according to claim 1, further comprising:
a level conversion module connected to the data processing module,
wherein the level conversion module is configured to convert a reference ground potential of the received data to a reference ground potential of a present stage, or to convert a reference ground potential of the transmission data to a reference ground potential of a next stage.

7. The cascade communication device according to claim 1, wherein the first interface and the second interface conform to an inter-integrated circuit (I2C) protocol or an serial peripheral interface (SPI) protocol.

8. A cascade communication method, comprising:
detecting an edge of a first clock signal;
generating a second clock signal according to the edge of the first clock signal; and
reconstructing a received data according to the first clock signal and the second clock signal to generate a transmission data,
wherein data is received in an uplink mode and transmitted in a downlink mode by a first interface, and the first clock signal is received by the first interface,
data is transmitted in the uplink mode and received in the downlink mode by a second interface, and the second clock signal is transmitted by the second interface.

9. The cascade communication method according to claim 8, wherein data is forwarded bit by bit in an uplink mode and data is forwarded byte by byte in a downlink mode.

10. The cascade communication method according to claim 8, wherein at the edge of the first clock signal, the first clock signal flips from a first level to a second level, and a corresponding edge of the second clock signal is generated after the edge of the first clock signal delayed to a first level period.

11. The cascade communication method according to claim 10, wherein a delay time T1 of a falling edge of the second clock signal relative to a falling edge of the first clock signal is:

$$(n-1)*Tclk + TL < T1 < n*Tclk,$$

wherein Tclk represents a clock period of the first clock signal, TL represents a low-level period of the first clock signal, and n is an arbitrary integer greater than or equal to 1.

12. The cascade communication method according to claim 11, wherein a delay time T2 of a rising edge of the second clock signal relative to a rising edge of the first clock signal is:

$$(n-1)*Tclk + TH < T2 < n*Tclk,$$

wherein Tclk represents a clock period of the first clock signal, TH represents a high-level period of the first clock signal, and n is an arbitrary integer greater than or equal to 1.

13. The cascade communication method according to claim 8, further comprising:

converting a reference ground potential of the received data to a reference ground potential of a present stage, or converting a reference ground potential of the transmission data to a reference ground potential of the next stage.

14. A battery management system for battery state management of a plurality of battery packs, wherein each of the plurality of battery packs comprises a plurality of battery cells, the plurality of battery packs are connected in series to provide a supply voltage, and the battery management system comprises:

a plurality of equalization modules respectively connected to the plurality of battery packs, configured to equalize voltages of the plurality of battery cells in corresponding battery pack to maintain consistency of the plurality of battery cells;

an analog front end connected to the plurality of equalization modules, configured to obtain a state parameter of the plurality of battery cells through the plurality of equalization modules; and a controller connected to the analog front end, configured to generate an equalization control signal according to the state parameter, wherein each of the plurality of equalization modules comprises a cascade communication device according to claim 1.

15. The battery management system according to claim 14, wherein the plurality of equalization modules serve as a plurality of node devices of a cascade communication system, respectively, and have a reference ground potential corresponding to the plurality of battery packs, respectively.

16. The battery management system according to claim 15, wherein the cascade communication device comprises: a level conversion module, configured to convert a reference ground potential of the transmission data to a reference ground potential of a next stage node device of the plurality of node devices; or to convert a reference ground potential of the received data to a reference ground potential of a current stage node device of the plurality of node devices.

* * * * *